United States Patent

Sakurai et al.

Patent Number: 5,863,704
Date of Patent: Jan. 26, 1999

[54] PHOTOSENSITIVE COMPOSITION AND PHOTOSENSITIVE RUBBER PLATE

[75] Inventors: Fusayoshi Sakurai, Yokohama; Haruo Ueno, Tokyo; Takao Suzuki, Narashino, all of Japan

[73] Assignee: Nippon Zeon Company, Ltd., Tokyo, Japan

[21] Appl. No.: 637,042

[22] Filed: Apr. 24, 1996

[30] Foreign Application Priority Data

Apr. 26, 1995 [JP] Japan ................................. 7-125706

[51] Int. Cl.$^6$ ............................ G03F 7/033; G03F 7/038; G03F 7/11
[52] U.S. Cl. .................................. 430/271.1; 430/286.1; 430/287.1; 430/300; 430/306; 522/110
[58] Field of Search .................... 430/281.1, 286.1, 430/287.1, 300, 306, 271.1; 522/110

[56] References Cited

U.S. PATENT DOCUMENTS

| | | | |
|---|---|---|---|
| 4,243,500 | 1/1981 | Glennon | 522/110 |
| 5,185,234 | 2/1993 | Nakatsukasa et al. | 430/286.1 |
| 5,344,744 | 9/1994 | Ueda et al. | 430/287.1 |
| 5,348,844 | 9/1994 | Garmong | 430/286.1 |
| 5,496,684 | 3/1996 | Farber et al. | 430/306 |

FOREIGN PATENT DOCUMENTS

| | | |
|---|---|---|
| 0699961 | 3/1996 | European Pat. Off. |
| 94/23342 | 10/1994 | WIPO |
| 96/10218 | 4/1996 | WIPO |

OTHER PUBLICATIONS

Datesbase WPI, Section Ch, Week 8549, Derwent Publications Ltd., London, GB; Class A18, AN 85–306228, XPOO2065643, abstract of JP 60 211 451 A (Asahi Chem. Ind. Co. Ltd.).

Database WPI, Section Ch, Week 9434, Derwent Publications Ltd., London, GB; Class A18, AN 940273941 XP002065644, abstract of JP 06 202 331 A (Nippon Zeon KK).

*Primary Examiner*—Cynthia Hamilton
*Attorney, Agent, or Firm*—Armstrong, Westerman, Hattori, McLeland & Naughton

[57] ABSTRACT

A photosensitive composition which comprises 5 to 55 parts by weight of a linear block copolymer ①  consisting essentially of only one polymer block A which is a polymer consisting essentially of aromatic vinyl monomer units as the main constitutive units and conjugated diene monomer units as secondary monomer units, and only one or two polymer blocks B each of which is a polymer consisting essentially of conjugated diene monomer units as the main constitutive units and aromatic vinyl monomer units as secondary monomer units, wherein among all the monomer units the aromatic vinyl monomer units constitute 15 to 30% by weight, the conjugated diene monomer units constitute 85 to 70% by weight, the total amount of the aromatic vinyl monomer units and the conjugated diene monomer units being 100% by weight, and wherein the total amount of the aromatic vinyl monomer units constituting molecular chain portions each having 8 or more successive aromatic vinyl monomer units is 30% by weight or more of the amount of all the aromatic vinyl monomer units, 10 to 60 parts by weight of a block copolymer ② consisting essentially of at least two polymer blocks C each of which is a polymer containing aromatic vinyl monomer units as the main constitutive units, and at least one polymer block D which is a polymer containing conjugated diene monomer units as the main constitutive units, 35 to 85 parts by weight of a hydrophilic copolymer ③, provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤.

19 Claims, 1 Drawing Sheet

PHOTOSENSITIVE COMPOSITION AND PHOTOSENSITIVE RUBBER PLATE

This invention relates to a photosensitive rubber plate and a photosensitive composition. More specifically, the invention relates to a photosensitive rubber plate which is excellent in transparency and strength balance, and can be developed in a short time after being exposed to light, and a photosensitive composition for obtaining the same.

A photosensitive flexographic printing plate can be obtained by making a photographic printing film adhere onto the surface of a printing plate, irradiating the film with an actinic light to expose part of the photosensitive layer to the light, and removing the unexposed part by washing (development) to form a relief. For an advantage not to emit harmful environment-polluting substances, such photosensitive flexographic printing plates wherein the unexposed parts can be developed with aqueous solvents have been researched.

As to materials for the photosensitive layers of water-developable photosensitive flexographic printing plates, it is required that they are excellent in transparency for light to reach the depths of the photosensitive layers, excellent in adherence to matter to be printed, excellent in balance between the tensile strength and breaking extension of the plates themselves (hereinafter, sometimes referred to as strength balance), and can be developed at a high development rate for facilitating relief formation after exposure to light.

As a material for the photosensitive layers is known a photosensitive elastomer composition comprising a ternary block copolymer such as a styrene-butadiene-styrene block copolymer or a styrene-isoprene-styrene block copolymer and a hydrophilic copolymer as main components, and a photopolymerizable ethylenically unsaturated monomer incorporated therein (Japanese Laid-open Patent Publication No. 211451/1985). However, a photosensitive rubber plate made using this photosensitive elastomer composition had problems that it is poor in transparency and insufficient in strength balance, and the development rate of the unexposed part with an aqueous solvent is slow.

Further, as another material for the photosensitive layers is proposed a photosensitive elastomer composition comprising a ternary block copolymer and a phosphoric ester group-containing hydrophilic copolymer as main components (EP 0699961). Although this composition has performances such as transparency, strength balance and a development rate in a practical level as a flexographic printing plate, there have still been points to be improved in development rate, strength balance, etc.

Thus, the object of the invention lies in providing such a photosensitive rubber plate that it is excellent in transparency and strength balance, and the development rate of the unexposed part with an aqueous solvent is fast, and providing a photosensitive composition useful for making the photosensitive rubber plate.

The present inventors have intensely made sequential researches, and as a result, have found out that a photosensitive rubber plate made from a photosensitive composition wherein two specific kinds of block copolymers are compounded is one capable of attaining the above object.

Thus, according to the invention, there is provided (1) a photosensitive composition which comprises 5 to 55 parts by weight of such a block copolymer ① that it has one polymer block A composed of a polymer containing an aromatic vinyl monomer unit as the main constitutive unit and one or two polymer blocks B each composed of a polymer containing a conjugated diene monomer unit as the main constitutive unit, and among all the monomer units the aromatic vinyl monomer unit is 15 to 30% by weight, the conjugated diene monomer unit is 85 to 70% by weight (the total of the aromatic vinyl monomer unit and the conjugated diene monomer unit is 100% by weight), 10 to 60 parts by weight of a block copolymer ② which has at least two polymer blocks C each composed of a polymer containing an aromatic vinyl monomer unit as the main constitutive unit and at least one polymer block D composed of a polymer containing a conjugated diene monomer unit as the main constitutive unit, 35 to 85 parts by weight of a hydrophilic copolymer ③ provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤.

According to the invention, especially, as preferred embodiments of the photosensitive composition of the above (1), photosensitive compositions as shown in the following (2) to (13) are provided.

(2) The photosensitive composition according to the above (1) wherein the amount of the block copolymer ① is 5 to 35 parts by weight, the amount of the block copolymer ② is 10 to 60 parts by weight, and the amount of the hydrophilic copolymer ③ is 35 to 85 parts by weight provided that the total amount of the block copolymer ①, the block copolymer ② and the hydrophilic copolymer ③ is 100 parts by weight.

(3) The photosensitive composition according to any of the above (1) and (2) wherein the aromatic vinyl monomer unit constituting the block copolymer ① or the block copolymer ② is a styrene unit.

(4) The photosensitive composition according to any of the above (1) to (3) wherein the conjugated diene monomer unit constituting the block copolymer ① or the block copolymer ② is a 1,3-butadiene unit or an isoprene unit.

(5) The photosensitive composition according to any of the above (1) to (4) wherein the block copolymer ① or the block copolymer ② is constituted by a 1,3-butadiene unit and a styrene unit.

(6) The photosensitive composition according to any of the above (1) to (5) wherein the block copolymer ① is such that the total amount of the aromatic vinyl monomer units constituting molecular chain parts each having 8 or more successive aromatic vinyl monomer units is 30% by weight or more of the amount of all the aromatic vinyl monomer units.

(7) The photosensitive composition according to any of the above (1) to (6) wherein the weight average molecular weight of the block copolymer ① is 100,000 to 400,000, and the value of weight average molecular weight/number average molecular weight is 1 to 1.5.

(8) The photosensitive composition according to any of the above (1) to (7) wherein the molecular chain of the polymer block A of the block copolymer ① and the molecular chain of the polymer block B thereof are bound respectively to both ends of a molecular chain composed of an aromatic vinyl monomer unit and a conjugated diene monomer unit and having a monomer unit composition different from the monomer unit composition of the polymer block A and the monomer unit composition of the polymer block B, and the weight of the intermediate molecular chain is 40% by weight or less of the block copolymer ①, and the weight ratio of the polymer block A to the polymer block B is 15/85 to 30/70.

(9) The photosensitive composition according to any of the above (1) to (8) wherein the block copolymer ① is such that the molecular chain of the polymer block A and the molecular chain of the polymer block B are bound respectively to both ends of a molecular chain having such an amount (% by weight) distribution of aromatic vinyl monomer units that gradual change is made from the amount (% by weight) of the aromatic vinyl monomer unit constituting the polymer block A to the amount (% by weight) of the aromatic vinyl monomer unit constituting the polymer block B.

(10) The photosensitive composition according to any of the above (1) to (9) wherein the vinyl bond content of the conjugated diene monomer unit part of the block copolymer ② is 15 to 70%.

(11) The photosensitive composition according to any of the above (1) to (10) wherein the block copolymer ② has a block constitution represented by C-D-C or $(C-D)_2$-X wherein X is the residue of the coupling agent or polyfunctional ionic polymerization initiator.

(12) The photosensitive composition according to any of the above (1) to (11) wherein the hydrophilic copolymer ③ is such that phosphoric ester groups or carboxyl groups bond to the molecular side chains.

(13) The photosensitive composition according to any of the above (1) to (12) wherein the hydrophilic copolymer ③ is such that phosphoric ester groups bond to the molecular side chains.

Further, according to the invention is provided, as application of the photosensitive composition, (14) A photosensitive rubber plate comprising the photosensitive composition according to any of the above (1) to (13).

According to the invention, especially, as preferred embodiments of the photosensitive rubber plate of the above (14), photosensitive rubber plates as shown in the following (15) to (19) are provided.

(15) A photosensitive rubber plate wherein a layer comprising the photosensitive composition according to any of the above (1) to (13) and a layer comprising an adhesive composition dissolving or swelling when contacted with an organic solvent are laminated.

(16) The photosensitive rubber plate according to the above (15) wherein the adhesive composition comprises a thermoplastic elastomer.

(17) The photosensitive rubber plate according to the above (15) wherein the adhesive composition comprises a thermoplastic elastomer and a photopolymerizable ethylenically unsaturated monomer.

(18) The photosensitive rubber plate according to any of the above (16) to (17) wherein the thermoplastic elastomer is a block copolymer having a polymer block composed of a polymer containing an aromatic vinyl monomer unit as the main constitutive unit, and a polymer block composed of a polymer containing a conjugated diene monomer unit as the main constitutive unit.

(19) The photosensitive rubber plate according to any of the above (16) to (17) wherein the thermoplastic elastomer is a block copolymer composed of a polystyrene block and a polybutadiene block or polyisoprene block.

BRIEF DESCRIPTION OF DRAWINGS

In the attached drawings.

DETAILED DESCRIPTION OF THE INVENTION

The photosensitive composition of the invention comprises the block copolymer ①, the block copolymer ②, the hydrophilic copolymer ③, the photopolymerizable ethylenically unsaturated monomer ④ and the photopolymerization initiator ⑤.

The block copolymer ① as the first component of the photosensitive composition of the invention has one polymer block A containing an aromatic vinyl monomer unit as the main constitutive unit and one or two polymer blocks B each containing a conjugated diene monomer unit as the main constitutive unit.

The polymer block A and the polymer block B contain the aromatic vinyl monomer unit and the conjugated diene monomer unit as the main constitutive units, respectively. In this connection, the main constitutive unit means a monomer unit occupying an amount exceeding 50% by weight of all the monomer units constituting the polymer block.

As the aromatic vinyl monomer constituting the main constitutive unit of the polymer block A, there can be mentioned styrene, o-methylstyrene, m-methylstyrene, p-methylstyrene, p-tert-butylstyrene, 1,3-dimethylstyrene, chlorostyrene, vinylnaphthalene, vinylanthracene, etc. Styrene is preferred among these aromatic vinyl monomers.

The amount of the aromatic vinyl monomer unit constituting the polymer block A is usually, an amount exceeding 50% by weight, preferably 70% by weight or more, more preferably 90% by weight or more, based on the weight of the polymer block A. The aromatic vinyl monomer unit exists in the block copolymer ① in a structure as shown in the following general formula (I)

In the general formula (I), Ar is an aryl group, and $R^1$, $R^2$ and $R^3$ each are independently a hydrogen atom, a halogen atom, an aryl group or an alkyl group.

As the conjugated diene monomer constituting the main constitutive unit of the polymer block B, there can be mentioned 1,3-butadiene, isoprene, 2,3-dimethyl-1,3-butadiene, 1,3-pentadiene, 1,3-hexadiene, chloroprene, etc. 1,3-Butadiene and isoprene are preferred among these conjugated dienes.

The amount of the conjugated diene monomer unit constituting the polymer block B is usually, an amount exceeding 50% by weight, preferably 70% by weight or more, more preferably 85% by weight or more, based on the weight of the polymer block B. The conjugated diene monomer unit exists in the block copolymer ① in a structure as shown in the following general formula (II) or (III).

-continued

In the general formula (II) or (III), $R^4$, $R^5$, $R^6$, $R^7$, $R^8$, $R^9$, $R^{10}$, $R^{11}$, $R^{12}$, $R^{13}$, $R^{14}$ and $R^{15}$ each are independently a hydrogen atom, a halogen atom, or an alkyl group.

The block copolymer ① may be one wherein a polar functional group is bound to the molecular chain. A block copolymer ① wherein a polar functional group is bound to the molecular chain can be obtained by polymerizing an aromatic vinyl monomer and a conjugated diene monomer, and then binding a compound having a polar functional group to the molecular chain through addition reaction or the like. As the polar functional group, there can be mentioned a carboxyl group, ester groups, an amino group, nitrile groups, etc.

In the block copolymer ①, the weight ratio between the amount of the aromatic vinyl monomer unit and the conjugated diene monomer unit is (the aromatic vinyl monomer unit amount/the conjugated diene monomer unit amount =) 15/85 to 30/70, preferably 18/82 to 28/72. When the amount of the aromatic vinyl monomer unit decreases, the washing rate of the unexposed part after the photosensitive composition was exposed to light becomes slower. On the other hand, when the amount of the aromatic vinyl monomer unit increases, the transparency of the photosensitive composition is lowered.

The content of the aromatic vinyl monomer unit is a value measured using $H^1$-NMR (500 MHz).

In the block copolymer ① used in the invention, the total amount of the aromatic vinyl monomer units constituting molecular chains wherein 8 or more the aromatic vinyl monomer units lie in a line (hereinafter, sometimes referred to as the amount of long chains) is usually, 30% by weight or more, preferably 45% by weight or more, particularly preferably 60% by weight or more. When the amount of aromatic vinyl monomer long chains is decreased, the washing rate of the unexposed part after the photosensitive composition is exposed to light is slowed.

The amount of long chains is a value obtained by ozone-cleaving all the double bonds of the conjugated diene monomer units, and conducting measurement using a gel permeation chromatograph (see Kobunshi Gakkai Yokoshu (Macromolecule Society Preliminary Manuscripts) 29 (9), 2055).

In the photosensitive composition of the invention, the weight average molecular weight of the block copolymer ① is, usually, 100,000 to 400,000, preferably 120,000 to 300,000. When the molecular weight decreases, the strength balance of the photosensitive rubber plate becomes bad. On the other hand, when the molecular weight increases, the washing rate of the unexposed part of the photosensitive composition is lowered.

The molecular weight is a value obtained by turning the value obtained by conducting measurement using the gel permeation chromatograph into the molecular weight of standard polystyrene.

Further, the block copolymer ① in the photosensitive composition of the invention is one wherein the value of weight average molecular weight/number average molecular weight is, usually, 1 to 1.5, preferably 1 to 1.3. When the weight average molecular weight/number average molecular weight goes beyond 1.5, the washing rate of the unexposed part of the photosensitive composition is lowered.

The block copolymer ① can, usually, be obtained by a solution polymerization method. For forming the long chains of the aromatic vinyl monomer unit, usually, a conjugated diene monomer is charged into a polymerization reactor, polymerization is started, and then polymerization is continued while an aromatic vinyl monomer is added; or polymerization of a monomer mixture comprising a conjugated diene monomer and an aromatic vinyl monomer is started at a low temperature, and polymerization reaction is continued while the temperature is gradually increased.

As combination block structures between the polymer block A and the polymer block B constituting the block copolymer ①, there are A-B and B-A-B.

As the block copolymer ①, there can be mentioned one wherein the molecular chain of the polymer block A and the molecular chain of the polymer block B are directly bound; and one (tapered block type) wherein the molecular chain of the polymer block A and the molecular chain of the polymer block B are bound respectively to both ends of a molecular chain composed of an aromatic vinyl monomer unit and a conjugated diene monomer unit and having a monomer unit composition different from the monomer unit composition constituting the polymer block A and the monomer unit composition constituting the polymer block B. For heightening the washability of unexposed parts and thin line reproduction, tapered block type one is preferred, and such a tapered block type one is particularly preferred that the molecular chain of the polymer block A and the molecular chain of the polymer block B are bound respectively to both ends of a molecular chain having such an amount (% by weight) distribution of aromatic vinyl monomer units that gradual change is made from the amount (% by weight) of the aromatic vinyl monomer unit constituting the polymer block A to the amount (% by weight) of the aromatic vinyl monomer unit constituting the polymer block B. The amount of the intermediate molecular chain having a monomer unit composition different from the monomer unit composition constituting the polymer block A and the monomer unit composition constituting the polymer block B is, usually, 40% by weight of less, preferably 20% by weight or less, based on the weight of the block copolymer.

The weight ratio between the polymer block A and the polymer block B constituting the block copolymer ① is, usually, (polymer block A/polymer block B =) 15/85 to 30/70, preferably 18/82 to 28/72.

The amount of the block copolymer ① in the photosensitive composition of the invention is 5 to 55 weight parts, preferably 5 to 35 weight parts, more preferably 10 to 20 weight parts among 100 weight parts as the total amount of the block copolymer ①, the later-described block copolymer ② and the hydrophilic copolymer ③. When the amount of the block copolymer ① becomes larger, the strength balance of the photosensitive rubber plate becomes worse, and when the amount becomes smaller, the washing rate of the unexposed part of the photosensitive composition is lowered.

The block copolymer ② which is the second component of the photosensitive composition of the invention is one having at least two polymer blocks C each containing an aromatic vinyl monomer unit as the main constitutive unit, and at least one polymer block D containing a conjugated diene monomer unit as the main constitutive unit. The polymer block C and the polymer block D contain the aromatic vinyl monomer and the conjugated diene monomer as the constitutive units, respectively.

As the aromatic vinyl monomer and the conjugated diene monomer constituting the polymer blocks C and D, respectively, there can be mentioned the same ones as mentioned as constituting the polymer block A and the polymer block B, respectively. In the block copolymer ②, the aromatic vinyl monomer exists as a structure unit as represented by the general formula (I), and the conjugated diene monomer exists as a structure unit as represented by the general formula (II) or (III). Styrene is preferred as the aromatic vinyl monomer, and 1,3-butadiene is preferred as the conjugated diene monomer.

The block copolymer ② can be one wherein a polar functional group is bound to the molecular chain. A block copolymer ② wherein a polar functional group is bound to the molecular chain can be obtained by polymerizing an aromatic vinyl monomer and a conjugated diene monomer, and then binding a compound having the polar functional group to the molecular chain through addition reaction or the like. As the polar functional group, there can be mentioned a carboxyl group, ester groups, an amino group, nitrile groups, etc.

The amount of the aromatic vinyl monomer unit constituting the polymer block C is, usually, an amount exceeding 50% by weight, preferably 70% by weight or more, more preferably 90% by weight or more, based on the weight of the polymer block C.

The weight average molecular weight of the polymer block C is, usually, 3,000 to 200,000, preferably 8,000 to 100,000.

The amount of the conjugated diene monomer unit constituting the polymer block D is, usually, an amount exceeding 50% by weight, preferably 60% by weight or more, more preferably 80% by weight or more, based on the weight of the polymer block D. When the amount is 50% by weight or less, the strength balance of a photosensitive rubber plate obtained using the photosensitive composition becomes bad.

As the block copolymer ② is preferred one wherein the vinyl bond content of the conjugated diene monomer unit part is, usually, 15 to 70%, preferably 25 to 55%. When the vinyl bond content becomes larger, the transparency and strength balance of the photosensitive rubber plate becomes better, and further the washing rate becomes faster.

The vinyl bond content is the rate of the amount of the conjugated diene monomer unit integrated in the bond mode of 1,2-bond or 3,4-bond as represented by the general formula (III) in a block copolymer to the amount of the conjugated diene monomer unit integrated in the bond mode of 1,2-bond, 3,4-bond or 1,4-bond in the block copolymer. The vinyl bond content is a value obtained by conducting measurement using a nuclear magnetic resonance apparatus.

The weight average molecular weight of the polymer block D is, usually, 5,000 to 500,000, preferably 10,000 to 300,000.

The weight ratio between the polymer block C and the polymer block D is, usually, (polymer block C/polymer block D =) 5/95 to 95/5, preferably 10/90 to 90/10, more preferably 15/85 to 75/25.

The block copolymer ② is one whose weight average molecular weight as a whole is, usually, 8,000 to 2,000,000, preferably 18,000 to 1,000,000, particularly preferably 50,000 to 400,000.

The weight average molecular weight is a value obtained by turning the value obtained by conducting measurement using gel permeation chromatograph into the molecular weight of standard polystyrene.

The block copolymer ②, which is a component of the photosensitive composition of the invention, is not limited by combination structure between the polymer block C and the polymer block D. As examples, there can be mentioned those represented by the general formulae $(C-D)_n$-C, $(C-D)_n$-C-D, D-$(C-D)_n$-C-D, $(C-D)_m$-X, $((C-D)_n$-C$)_m$ X, $(D-C-(D-C)_n)_m$-X and $(D-C-(D-C)_n$-D$)_m$-X (in the formulae, C is the polymer block C, D is the polymer block D, X is the residue of the coupling agent or polyfunctional ionic polymerization initiator, n is an integer of 1 to 10, preferably 1 to 5, and m is an integer of 2 to 10, preferably 2 to 5). As the coupling agent, there can be mentioned tin tetrachloride, silicon tetrachloride, epoxidized esters, polyvinyl compounds, carboxylic esters, polyhalogenated hydrocarbons, etc, and as the polyfunctional ionic polymerization initiator, there can be mentioned polyfunctional organolithium compounds etc. Among these examples, those of the structure represented by the general formula C-D-C or $(C-D)_2$-X are preferred.

The amount of the block copolymer ② in the photosensitive composition of the invention is 10 to 60 weight parts, preferably 20 to 40 weight parts among 100 weight parts as the total amount of the above-mentioned block copolymer ①, the block copolymer ② and the later-described hydrophilic copolymer ③. Further, the total amount of the block copolymer ① and the block copolymer ② is, usually, 15 to 65 weight parts, preferably 30 to 50 weight parts. When the total amount goes beyond 65 weight parts, the washing rate of a photosensitive rubber plate obtained using the photosensitive composition is lowered. On the other hand, when the total amount is under 15 weight parts, the processability of the photosensitive composition and the resistance to aqueous ink and strength balance of the photosensitive rubber plate are lowered.

The hydrophilic copolymer ③, which is the third component of the photosensitive composition of the invention, is one wherein a hydrophilic group such as —OH, —COO—, —COOH, —NH$_2$, —SO$_3$—, —SO$_3$H, —PO(OH)$_2$, —PO(OH)—, >PO— or —CN, preferably a phosphoric ester group such as —PO(OH)$_2$, —PO(OH)— or >PO— is bound to the molecular side chain.

The hydrophilic copolymer ③ is a copolymer obtained by polymerizing an ethylenically unsaturated monomer having the above hydrophilic group with a monomer copolymerizable therewith.

As the ethylenically unsaturated monomer having the hydrophilic group, there can be mentioned ethylenically unsaturated monocarboxylic acids such as acrylic acid and methacrylic acid; ethylenically unsaturated polyvalent carboxylic acids such as maleic acid, fumaric acid, citraconic acid and itaconic acid; partially esterified products of ethylenically unsaturated polyvalent carboxylic acids such as monomethyl maleate and monomethyl itaconate; ethylenically unsaturated carboxylic acid hydroxyalkyl esters such as hydroxyethyl acrylate, hydroxypropyl acrylate, hydroxyethyl methacrylate and hydroxypropyl methacrylate; ethylenically unsaturated nitrile monomers such as methacrylonitrile and acrylonitrile; phosphoric ester group-containing ethylenically unsaturated monomers such as 2-acryloxyethyl phosphate, 3-acryloxypropyl phosphate, 2-acryloxypropyl phosphate, 4-acryloxybutyl phosphate, bis(2-acryloxyethyl) phosphate, bis(3-acryloxypropyl) phosphate, bis(4-acryloxybutyl) phosphate, diethylene glycol acrylate phosphate, triethylene glycol acrylate phosphate, polyethylene glycol acrylate phosphate, bis(diethylene glycol acrylate) phosphate, bis(triethylene glycol acrylate) phosphate, bis(polyethylene glycol acrylate) phosphate, 2-methacryloxyethyl phosphate, 3-methacryloxypropyl phosphate, 2-methacryloxypropyl phosphate, 4-methacryloxybutyl phosphate, bis(2-methacryloxyethyl) phosphate, bis(3-methacryloxypropyl) phosphate, bis(4-methacryloxybutyl) phosphate, diethylene glycol methacrylate phosphate, triethylene glycol methacrylate phosphate, polyethylene glycol methacrylate phosphate, bis(diethylene glycol methacrylate) phosphate, bis(triethylene glycol methacrylate) phosphate, and bis(polyethylene glycol methacrylate) phosphate; sodium styrenesulfonate; ethylenically unsaturated aminoalkyl esters such as t-butylaminoethyl acrylate, N,N-diethylaminoethyl acrylate and N,N-dimethylaminoethyl acrylate, and methacrylates corresponding to them; etc. Preferred among these hydrophilic group-containing ethylenically unsaturated monomers are phosphoric ester group-containing ethylenically unsaturated monomers, particularly ethylene acrylate phosphate and propylene acrylate phosphate and methacrylate phosphates corresponding to them.

The amount of the hydrophilic group-containing ethylenically unsaturated monomer is, usually, 5 to 35% by weight, preferably 5 to 25% by weight of all the monomers used for obtaining the hydrophilic copolymer ③. When the amount is under 5% by weight, the washing rate of a photosensitive rubber plate obtained using the photosensitive composition tends to be lowered. When the amount goes beyond 35% by weight, the processability of the photosensitive composition and the resistance to aqueous ink of the photosensitive rubber plate tend to be lowered.

The above phosphoric ester group-containing ethylenically unsaturated monomers are compounds represented by the general formula (IV)

wherein $R^1$ is a hydrogen atom or a methyl group, $R^3$ and $R^4$ each are independently a hydrogen atom or an alkyl group, l is 1 or 2, m and n each are independently an integer of 1 to 20.

As the monomer copolymerizable with the hydrophilic group-containing ethylenically unsaturated monomer, there can be mentioned aromatic vinyl monomers such as styrene, o-methylstyrene, m-methylstyrene, p-methylstyrene, p-tert-butylstyrene, 1,3-dimethylstyrene, chlorostyrene, vinylnaphthalene and vinylanthracene; ethylenically unsaturated carboxylic acid alkyl esters such as methyl acrylate, ethyl acrylate, propyl acrylate, n-amyl acrylate, isoamyl acrylate, hexyl acrylate, ethylhexyl acrylate, octyl acrylate, glycidyl acrylate, methyl methacrylate, ethyl methacrylate, propyl methacrylate, n-amyl methacrylate, isoamyl methacrylate, hexyl methacrylate, ethylhexyl methacrylate, octyl methacrylate and glycidyl methacrylate; ethylenically unsaturated glycidyl ethers such as allyl glycidyl ether; conjugated diene monomers such as 1,3-butadiene, isoprene, chloroprene and 1,3-pentadiene; aromatic polyvinyl monomers such as divinylbenzene and trivinylbenzene; polyvalent ethylenically unsaturated carboxylic acid ester monomers such as ethylene glycol dimethacrylate, ethylene glycol diacrylate, trimethylolpropane triacrylate and propylene glycol diacrylate; etc.

Among these monomers copolymerizable with the hydrophilic group-containing monomers, conjugated diene monomers, particularly 1,3-butadiene and isoprene are preferably used for heightening the strength balance of the photosensitive rubber plate. The amount of the conjugated diene monomers is, usually, 40 to 90% by weight, preferably 50 to 80% by weight of all the monomers used for obtaining the hydrophilic copolymer ③. When the amount is under 40% by weight, the strength of the photosensitive rubber plate is lowered. When the amount goes beyond 90% by weight, the washing rate of the photosensitive rubber plate is lowered.

For heightening the processability of the photosensitive composition and heightening the transparency and strength of the photosensitive rubber plate, a polyvalent ethylenically unsaturated monomer, particularly divinylbenzene or ethylene glycol dimethacrylate is preferably used. The amount of the polyvalent ethylenically unsaturated monomer is, usually, 10% by weight or less of all the monomers used for obtaining the hydrophilic copolymer ③.

The hydrophilic copolymer ③ used for the photosensitive composition of the invention is, usually, obtained by emulsion-polymerizing the above monomers and then either aggregating the resultant emulsion and evaporating the volatile matter, or freeze-coagulating the emulsion.

The amount of the hydrophilic copolymer ③ used for the photosensitive composition of the invention is 35 to 85 weight parts, preferably 50 to 70 weight parts among 100 weight parts as the total amount of the above-mentioned block copolymer ① and block copolymer ② and the hydrophilic copolymer ③.

As the photopolymerizable ethylenically unsaturated monomer ④, which is the fourth component of the photosensitive composition of the invention, there can be mentioned aromatic vinyl monomers such as styrene, o-methylstyrene, m-methylstyrene, p-methylstyrene, p-tert-butylstyrene, 1,3-dimethylstyrene, chlorostyrene, vinylnaphthalene, vinylanthracene, divinylbenzene and trivinylbenzene; ethylenically unsaturated nitrile monomers such as acrylonitrile and methacrylonitrile; ethylenically unsaturated carboxylic ester monomers such as methyl acrylate, ethyl acrylate, propyl acrylate, n-amyl acrylate, isoamyl acrylate, hexyl acrylate, ethylhexyl acrylate, octyl acrylate, glycidyl acrylate, methyl methacrylate, ethyl methacrylate, propyl methacrylate, n-amyl methacrylate, isoamyl methacrylate, hexyl methacrylate, ethylhexyl methacrylate, octyl methacrylate, hydroxyethyl acrylate, hydroxypropyl acrylate, hydroxyethyl methacrylate, hydroxypropyl methacrylate, glycidyl methacrylate, ethylene glycol diacrylate, trimethylolpropane triacrylate, 1,4-butanediol diacrylate, 1,4-butanediol dimethacrylate, propylene glycol diacrylate, 1,6-hexanediol diacrylate, 1,6-hexanediol dimethacrylate, 1,9-nonanediol diacrylate, 1,9-nonanediol dimethacrylate, methoxyethylene glycol acrylate, methoxypropylene glycol methacrylate, methoxyethylene glycol methacrylate, methoxypropylene glycol acrylate, diethyl maleate and dimethyl itaconate; ethylenically unsaturated glycidyl ethers such as allyl glycidyl ether; ethylenically unsaturated monocarboxylic acids such as acrylic acid and methacrylic acid; ethylenically unsaturated polyvalent carboxylic acids such as maleic acid, fumaric acid, citraconic acid and itaconic acid; partially esterified products of ethylenically unsaturated polyvalent carboxylic acids such as monoethyl maleate and monomethyl itaconate; phosphoric ester group-containing ethylenically unsaturated monomers represented by the general formula (IV) such as ethylene acrylate phosphate, trimethylene acrylate phosphate, propylene acrylate phosphate, tetramethylene acrylate phosphate, (bis)ethylene acrylate phosphate, (bis)trimethylene acrylate phosphate, (bis)tetramethylene acrylate phosphate, diethylene glycol acrylate phosphate, triethylene glycol acrylate phosphate, polyethylene glycol acrylate phosphate, (bis)diethylene glycol acrylate phosphate, (bis)triethylene glycol acrylate phosphate, and (bis)polyethylene glycol acrylate phosphate, and methacrylate phosphates corresponding to them; etc.

The amount of the photopolymerizable ethylenically unsaturated monomer ④ is 5 to 300 weight parts, preferably 10 to 200 weight parts, based on 100 weight parts as the total amount of the block copolymer ①, the block copolymer ② and the hydrophilic copolymer ③. When the amount is under 5 weight parts, the strength of the photosensitive rubber plate is lowered because curing of the photosensitive composition with an actinic light becomes insufficient. On the other hand, when the amount goes beyond 300 weight parts, the strength and solvent resistance of the photosensitive rubber plate are lowered.

As the photopolymerization initiator ⑤, which is the fifth component of the photosensitive composition, there can be mentioned α-diketones such as diacetyl and benzil; acyloins such as benzoin and pivaloin; acyloin ethers such as benzoin methyl ether, benzoin ethyl ether and benzoin isopropyl ether; polynuclear quinones such as 1,4-naphthoquinone and anthraquinone; etc.

The amount of the photopolymerization initiator ⑤ is 0.1 to 10 weight parts, preferably 0.5 to 5 weight parts, based on 100 weight parts as the total amount of the block copolymer ①, the block copolymer ② and the hydrophilic copolymer ③. When the amount is under 0.1 weight part, the strength of the photosensitive rubber plate is lowered because curing of the photosensitive composition with an actinic light becomes insufficient. On the other hand, when the amount goes beyond 10 weight parts, the photopolymerization rate is lowered.

It is possible to compound, when needed, a plasticizer, a preservative stabilizer, etc., as other components, into the photosensitive composition of the invention.

As the plasticizer, there can be mentioned hydrocarbon oils such as naphthene oil and paraffin oil; polystyrene and polyacrylates each having a molecular weight of 3,000 or less; liquid 1,2-polybutadiene and liquid 1,4-polybutadiene and their end-modified products; liquid acrylonitrile-butadiene copolymers and liquid styrene-butadiene copolymers and their carboxylated products; etc.

As the preservation stabilizer, there can be mentioned phenols such as hydroquinone, pyrogallol, p-methoxyphenol, t-butylcatechol and 2,6-di-t-butyl-p-cresol; quinones such as benzoquinone, p-toluquinone and p-xyloquinone; amines such as phenyl-α-naphthylamine, etc.

The photosensitive composition of the invention can, usually, be prepared by kneading the above-mentioned components using a kneading machine such as a kneader or a roll mill.

The order of kneading is not particularly limited, but for obtaining a uniform composition, it is recommendable to knead the hydrophilic copolymer ③ and the block copolymers ① and ②, and then add the photopolymerizable ethylenically unsaturated monomer ④ and the photopolymerization initiator ⑤ and knead the mixture.

The photosensitive rubber plate of the invention is specifically described below referring to drawings.

The photosensitive rubber plate 1 of the invention is, usually, one formed into a plate from the photosensitive composition of the invention. As seen from FIG. 1, a base film 4, a slip film 3 and a protector film 7 are, usually, laminated on the photosensitive rubber plate 1 of the invention.

Figure 1:
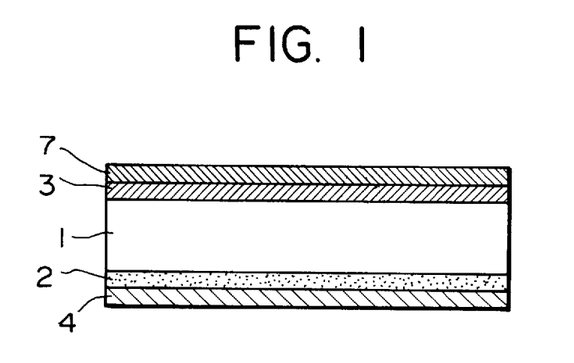
FIG. 1 is a cross section showing an example of flexographic printing laminates containing the photosensitive rubber plate of the invention.

The base film 4 is laminated on one surface of the photosensitive rubber plate. The base film 4 is peeled when the photosensitive rubber plate 1 is laminated on the later-described support plate. The base film 4 is formed using a flexible resin. As the flexible resin, there can be mentioned polyethylene terephthalate, polypropylene, polyimides, polyamides, etc. Further, in order to make the base film 4 easily peel from the photosensitive rubber plate 1 when the photosensitive rubber plate 1 is laminated on the support plate, it is preferred to place a peeling layer (not shown in the drawings) on the surface of the base film 4 contacting with the surface of the photosensitive rubber plate 1. The peeling layer is, usually, formed using a silicone, an alkyd resin, an urethane resin or the like. Reference No. 2 in FIG. 1 is the layer of an adhesive composition for laminating the photosensitive rubber plate 1 on the support plate (Reference No. 5 in FIG. 2) after the base film 4 was peeled. When the photosensitive rubber plate 1 was not laminated on a support plate, the base film 4 is made to adhere to the photosensitive rubber plate 1 so that it may not be peeled therefrom.

The slip film 3 is laminated on the surface of the photosensitive rubber plate 1 on which the base film 4 is not laminated. The surface of the photosensitive rubber plate 1 is, usually, strongly adhesive, and therefore, when an original image film is directly placed on the surface, there sometimes arise problems that bubbles go between the photosensitive rubber plate 1 and the original image film, irregular refraction of the actinic light occurs, and thereby the reproduction of the relief becomes bad, and moreover, the original image film is contaminated and cannot be reused. However, by laminating the slip film 3, these problems are obviated.

The slip film 3 is formed using a non-adhesive water-soluble high molecular compound. As such water-soluble high molecular compound, there can be mentioned polyvinyl alcohols, polyvinylpyrrolidone, polyacrylic acid, polyacrylamide, polyethylene oxide and polyethyleneimine, and their derivatives; etc. Preferred among them is polyvinyl alcohols, and particularly preferred are such polyvinyl alcohols that their saponification degrees are 65 to 80% by mole and their viscosities measured at a temperature of 20° C. using a Höppler viscometer are 10 cp or less.

The thickness of the slip film 3 is, usually, 0.5 to 10 μm. When the thickness is too large, poor adhesion with the original image film is liable to occur. When the thickness is too small, the effect to prevent the original image film from adhering becomes small.

For laminating the slip film 3 on the photosensitive rubber plate 1, a method of directly applying to the surface a solution of the water-soluble high molecular compound can be adopted, but, usually, a method is adopted which comprises making a laminate of a later-described protector film 7 and a slip film 3 obtained by applying a solution of the water-soluble high molecular compound onto the protector film 7, adhere onto the photosensitive rubber plate 1 so that the slip film 3 can contact therewith.

The protector film 7 is laminated on the surface of the photosensitive rubber plate 1 opposite to the surface on which the base film 4 is laminated. Usually, the lamination is made so that the slip film 3 can exist between the photosensitive rubber plate 1 and the protector film 7. The protector film 7 is placed for preventing the photosensitive rubber plate 1 from deforming by external force at the time of storage or transportation, and peeled when the original image film is placed on the slip film 3 before exposure to light.

The protector film 7 is formed using a flexible resin. As the flexible resin, there can be mentioned polyethylene terephthalate film, polyethylene film, polypropylene film, polystyrene film, etc. Further, for making the protector film 7 easily peel from the slip film 3, it is preferred to place a peeling layer on the surface of the protector film 7. The peeling layer is, usually, formed using a silicone, an alkyd resin, an urethane resin or the like. The thickness of the protector film 7 is, usually, 75 to 200 μm, preferably 100 to 150 μm. When the thickness is too small, the film strength becomes short, and the photosensitive rubber plate 1 formed is liable to be deformed. On the other hand, when the thickness is too large, the film strength becomes too strong, and therefore, peeling from the photosensitive rubber plate 1 becomes difficult.

Figure 2:
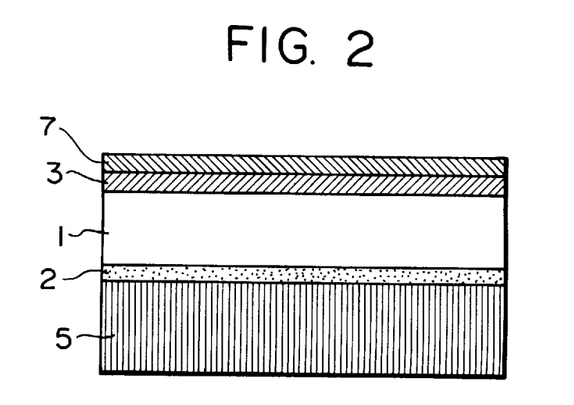
FIG. 2 is a cross section showing another example of flexographic printing laminates containing the photosensitive rubber plate of the invention.

When the photosensitive rubber plate 1 of the invention is used, for example, for use of corrugated board printing, the photosensitive rubber plate 1 is used after being laminated on a support plate 5, as shown in FIG. 2.

The support plate 5 is, usually, a plate composed of an elastomer. As the elastomer forming the support plate 5, there can be mentioned natural rubber, synthetic rubbers, soft vinyl chloride resins, etc. Further, for adjusting pressure given at the time of flexographic printing, it is possible to use a support plate formed from a foam as the support plate 5.

The photosensitive rubber plate 1 having strong aqueous developability is low in compatibility with organic solvent-type adhesives, and thus, weak in adhesion with the support plate 5. Therefore, for making the photosensitive rubber plate 1 strongly adhere to the support plate 5, it is preferred to place a layer 2 of an adhesive composition between the photosensitive rubber plate 1 and the above-mentioned base film 4, as shown in FIG. 1.

The adhesive composition is a composition containing a thermoplastic elastomer which is dissolved or swelled by contact with an organic solvent.

In the above, the organic solvent is one dissolving or swelling the thermoplastic elastomer. For example, there can be mentioned carboxylic acid alkyl esters such as ethyl acetate, methyl acetate and butyl acetate; ketones such as acetone, methyl ethyl ketone, methyl isobutyl ketone and cyclohexanone; aromatic hydrocarbons such as benzene, toluene and xylene; alicyclic hydrocarbons such as cyclopentane and cyclohexane; halogenated hydrocarbons such as trichloroethane, trichloroethylene, methylene chloride and carbon tetrachloride; etc.

As the thermoplastic elastomer, the same ones as mentioned about the block copolymer ① or ② are mentioned.

It is preferred, for heightening adhesion strength, to compound the above-mentioned photopolymerizable ethylenically unsaturated monomer, besides the thermoplastic elastomer, into the adhesive composition.

The amount of the photopolymerizable ethylenically unsaturated monomer to be compounded in the adhesive composition is, usually, 0.1 to 50 weight parts, preferably 0.5 to 30 weight parts, based on 100 weight parts of the thermoplastic elastomer. When the amount is too large, there arises unevenness in the thickness of the layer of the adhesive composition, and the appearance of the photosensitive rubber plate becomes ugly.

A photopolymerization initiator can further, if necessary, be compounded into the adhesive composition.

The thickness of the layer of the adhesive composition is, usually, 30 to 200 μm, preferably 40 to 100 μm.

The invention is further described in detail below according to examples, but is not limited by these examples at all. Parts and % in the examples and comparative examples are based on weight unless particularly otherwise defined.

Evaluation of photosensitive compositions and photosensitive rubber plates was conducted according to the following test methods.

[Washability]

A small piece of 30 mm×30 mm was cut out from a photosensitive rubber plate, and washed with an aqueous polyoxyethylene nonylphenyl ether solution having a concentration of 2% and a temperature of 50° C. using a washout machine for photosensitive flexographic plates (JOW-A$_2$-SS type, made by Nippon Denshi Seiki Co., Ltd.), and time needed by the time when the thickness of this piece became 2 mm was measured, and the superiority or inferiority of washability was determined according to the following criterion.

a: under 8 minutes
b: 8 minutes or more, under 11 minutes
c: 11 minutes or more, under 14 minutes
d: 14 minutes or more, under 17 minutes
e: 17 minutes or more The grade a means being best in washability, and grades b, c, d and e mean becoming worse in washability in this order.

[Transparency]

A small piece of 30 mm×30 mm cut out from a photosensitive rubber plate was used as a sample, and measured for transmission concentration using a Macbeth densitometer (transmission type). Smaller values show better transparency.

[Reproduction of Relief Image]

One surface of a photosensitive rubber plate was exposed to light using an ultraviolet ray-exposuring apparatus (JE-A$_2$-SS type, made by Nippon Denshi Seiki Co., Ltd.) so that the thickness of the cured layer could be on the order of 1.5 mm. Then, the polyester film on the surface not exposed to light was peeled, a negative film for reproduction evaluation was made to adhere onto the surface, and this side was exposed to light for 15 minutes using the ultraviolet ray-exposuring apparatus. The negative film was peeled, and the unexposed part was dissolved and removed using an aqueous polyoxyethylene nonylphenyl ether solution having a concentration of 2% and a temperature of 50° C. Then, the resultant rubber plate was dried at 70° C. for 20 minutes, and the surface where the unexposed part was removed was exposed to light again using the ultraviolet ray-exposuring apparatus to prepare a relief image for reproduction evaluation.

This relief image was observed by a stereoscopic microscope of 50 magnifications, and evaluation was made according to the following criterion.

① Reproduction of convex fine lines

The minimum width of the convex fine lines which had the same widths as the convex fine lines of the negative film, and were reproduced without distortion and thickening was measured. Smaller values show better reproduction of convex fine lines.

② Reproduction of a concave fine line 0.7 mm wide

The depth of the groove of a concave fine line 0.7 mm wide was measured. Larger values show better reproduction of the convex fine line.

[Strength Balance]

The plane part of the rubber plate used for evaluation of the reproduction of relief image was subjected to a tensile test under the conditions of a tensile rate of 500 mm/minute and a distance between two gage marks of 20 mm according to JIS K-6301 "Tensile Test Method", and the product (tensile product) of the tensile strength and elongation at the time of rupture was determined. Larger values of the tensile product show better strength balance.

Reference Example 1

(Preparation of Block Copolymer ②)

2,300 Parts of dehydrated purified cyclohexane, 0.4 part of tetramethylethylenediamine and 0.8 part of n-butyl lithium were charged in a stainless steel-made polymerizer equipped with a stirrer, whose atmosphere had previously been replaced with nitrogen, and then 100 parts of styrene was added, and polymerization was conducted at 70° C. for one hour. Then, 800 parts of 1,3-butadiene was added over a period of one hour while the temperature of the inside of the polymerizer was maintained at 70° C., polymerization was continued for further 30 minutes after completion of the addition, 100 parts of styrene was added, polymerization was continued for one hour, and finally, 0.05 part of methanol was added to obtain a solution of a block copolymer.

5 Parts of 2,6-di-tert-butyl-4-methylphenol and 5 parts of trisnonylphenyl phosphate were added to this solution, the solvent was removed by a steam coagulation method, and the moisture was removed using a vacuum dryer to obtain a C-D-C type block copolymer α. The molecular weight, etc. of this block copolymer α were shown in Table 1.

Reference Example 2

(Preparation of Block Copolymer ②)

2,300 parts of dehydrated purified cyclohexane, 0.75 part of tetramethylethylenediamine and 1.21 parts of n-butyl lithium were charged in a stainless steel-made polymerizer equipped with a stirrer, whose atmosphere had previously been replaced with nitrogen, and then 200 parts of styrene was added, and polymerization was conducted at 70° C. for one hour. Then, 800 parts of 1,3-butadiene was added over a period of one hour while the temperature of the inside of the polymerizer was maintained at 70° C., polymerization was continued for further 30 minutes after completion of the addition, 1.6 parts of paradibromobenzene was added, reaction was conducted at 70° C. for 2 hours, and finally, 0.08 part of methanol was added to obtain a block copolymer solution.

5 parts of 2,6-di-tert-butyl-4-methylphenol and 5 parts of trisnonylphenyl phosphate were added to this solution, the solvent was removed by a steam coagulation method, and the moisture was removed using a vacuum dryer to obtain a block copolymer β. The molecular weight, etc. of this $(C-D)_2$-X type block copolymer β were shown in Table 1.

TABLE 1

|  | Block copolymer ② | |
|---|---|---|
|  | α | β |
| Amount of polymer block C [%] | 19.8 | 20.3 |
| Molecular weight of polymer block C | 1.05 | 1.15 |
| Amount of polymer block D [%] | 80.2 | 79.7 |
| Vinyl bond amount in polymer block D [%] | 30.2 | 31.0 |
| Molecular weight of polymer block D | 11.3 | 6.35 |
| Molecular weight of whole block polymer | 13.4 | 15.0 |
| Styrene amount in whole block polymer [%] | 19.8 | 20.3 |

Molecular weight in Table 1 means weight average molecular weight, and its unit is ten thousand.

Reference Example 3

(Preparation of Hydrophilic Copolymer ③)

200 Parts of water was charged in an autoclave, 60 parts of butadiene, 9 parts of methyl acrylate, 20 parts of 2-methacryloxy ethyl phosphate, 10 parts of styrene, 1 part of divinylbenzene, 4 parts of sodium dodecylbenzenesulfonate, 0.3 part of potassium persulfate and 0.4 part of t-dodecylmercaptan were then added, polymerization reaction was initiated by heating to 50° C., a terminator was added at the time when the polymerization conversion reached 95% to cease the reaction, and the reaction solution was cooled with water to obtain an emulsion of the polymer. This emulsion was freeze-coagulated, and the resultant Crumbs were separated, washed with water, dehydrated and vacuum-dried at 60° C. to obtain a hydrophilic copolymer.

Reference Example 4

(Preparation of Block Copolymer ①)

580 Parts of 1,3-butadiene, 8,500 parts of cyclohexane and 0.16 part of tetramethylethylenediamine were charged in a stainless steel-made polymerizer equipped with a stirrer, whose atmosphere had previously been replaced with nitrogen, and then a solution of 0.64 part of n-butyl lithium in n-hexane was added, and the contents of the polymerizer were heated to 50° C. to start polymerization. The temperature of the inside of the polymerizer was elavated to 80° C. in accordance with the progress of polymerization reaction. After completion of the polymerization reaction of 1,3-butadiene, 30 parts of styrene and 120 parts of 1,3-butadiene were added, and polymerization reaction was successively progressed for one hour. Then, 270 parts of styrene was successively added over a period of 30 minutes to further continue polymerization. After the polymerization reaction of all the monomers ceased, 1.6 parts of methanol was added to stop the reaction, and the resultant polymer was coagulated by adding 10 parts of 2,6-di-tert-butyl-p-cresol and making steam blow into the polymerizer. Then, the polymer was subjected to water squeezing using rolls, and dried under reduced pressure at 60° C. for 24 hours to obtain a tapered A-B type block copolymer δ.

The molecular weight, etc. of this block copolymer δ were shown in Table 2.

Reference Example 5

(Preparation of Block Copolymer ①)

780 Parts of 1,3-butadiene, 8,500 parts of cyclohexane and 0.14 part of tetramethylethylenediamine were charged in a stainless steel-made polymerizer equipped with a stirrer, whose atmosphere had previously been replaced with nitrogen, and then a solution of 0.83 part of n-butyl lithium in n-hexane was added, and the contents of the polymerizer were heated to 50° C. to start polymerization. The temperature of the inside of the polymerizer was elavated to 80° C. in accordance with the progress of polymerization reaction. After completion of the polymerization reaction of 1,3-butadiene, 220 parts of styrene was successively added over a period of 30 minutes, and polymerization was further continued. After the polymerization reaction of all the monomers ceased, the reaction was stopped, and the resultant polymer was coagulated, and dried under reduced pressure to obtain a A-B type block copolymer ε, all in the same manner as in Reference example 4. The molecular weight, etc. of this block copolymer C were shown in Table 2.

Reference Example 6

(Preparation of Block Copolymer ①)

250 Parts of styrene, 750 parts of 1,3-butadiene, 8,500 parts of cyclohexane and 0.13 part of tetramethylethylenediamine were charged in a stainless steel-made polymerizer equipped with a stirrer, whose atmosphere had previously been replaced with nitrogen, and then a solution of 0.7 part of n-butyl lithium in n-hexane was added, and the contents of the polymerizer were heated to 45° C. to start polymerization. The temperature of the inside of the polymerizer was elavated to 95° C. in accordance with the progress of polymerization reaction. After completion of the polymerization reaction of all the monomers, the reaction was stopped, and the resultant polymer was coagulated and dried under reduced pressure to obtain a tapered A-B type block copolymer $\zeta$, all in the same manner as in Reference example 4. The molecular weight, etc. of this block copolymer $\zeta$ were shown in Table 2.

Reference Example 7

(Preparation of Block Copolymer $\eta$)

8,500 Parts of cyclohexane and 0.31 part of tetramethylethylenediamine were charged in a stainless steel-made polymerizer equipped with a stirrer, whose atmosphere had previously been replaced with nitrogen, and then a solution of 0.45 part of n-butyl lithium in n-hexane was added, and the contents of the polymerizer were held at 40° C. Then, 1,000 parts of a monomer mixture of 25% styrene and 75% 1,3-butadiene was successively added over a period of 200 minutes to conduct polymerization reaction. The temperature of the inside of the polymerizer was elavated to 80° C. in accordance with the progress of polymerization reaction. After completion of the polymerization reaction of all the monomers, 0.23 part of tin tetrachloride was added, and reaction was conducted for 60 minutes. After completion of the reaction, the reaction was stopped, and the resultant polymer was coagulated and dried under reduced pressure to obtain a random copolymer $\eta$, all in the same manner as in Reference example 4. The molecular weight, etc. of this random block copolymer $\eta$ were shown in Table 2.

Reference Example 8

(Preparation of Block Copolymer $\theta$)

A tapered A-B type block copolymer $\theta$ was obtained in the same manner as in Reference example 4 except that, in Reference example 4, the amount of 1,3-butadiene at the time of charge was changed to 500 parts, the addition amounts of styrene and 1,3-butadiene after completion of the 1,3-butadiene polymerization reaction to 40 parts and 100 parts, respectively, and the subsequent styrene addition amount to 360 parts. The molecular weight, etc. of this block copolymer $\theta$ were shown in Table 2.

TABLE 2

| | Copolymer | | | | | |
| --- | --- | --- | --- | --- | --- | --- |
| | $\delta$ | $\epsilon$ | $\zeta$ | $\eta$ | $\theta$ | $\iota$ |
| Weight average molecular weight [ten thousand] | 16 | 12 | 14 | 18 | 15 | 43 |
| Weight average molecular weight/Number average molecular weight | 1.1 | 1.1 | 1.2 | 1.8 | 1.1 | 3.6 |
| Amount of styrene unit [%] | 25.0 | 22.0 | 25.0 | 25.0 | 40.0 | 23.5 |
| Amount of long chain [%] | 82.5 | 99.9 | 52.0 | 0.4 | 82.6 | 0.2 |

Note)
The copolymer $\iota$ is NIPOL 1502 (styrene-1,3-butadine random copolymer, made by Nippon Zeon Co., Ltd.).

EXAMPLE 1

55 Parts of the hydrophilic copolymer, 30 parts of the block copolymer $\alpha$, 15 parts of the block copolymer $\delta$, 55 parts of liquid polybutadiene (Nisso PB, B1000, made by Nippon Soda Co., Ltd.) and 0.2 part of 2,6-di-tert-butyl-p-cresol were kneaded at 150° C. using a kneader until the mixture became uniform, the kneader temperature was lowered to 120° C., 10 parts of 1,6-hexanediol diacrylate, 10 parts of 1,6-hexanediol dimethacrylate, 1 part of benzoin methyl ether and 0.02 part of mono-methylhydroquinone were added, and the mixture was further kneaded to obtain a photosensitive composition.

This photosensitive composition was placed in a frame mold whose spacer thickness is 3 mm and whose top and bottom were open, the top and bottom of the opening of the frame mold were covered with polyester films each 0.1 mm thick, and the contents were heated and pressurized under the conditions of 110° to 130° C. and 150 kgf using a pressing machine, and then cooled to obtain a photosensitive rubber plate having a total thickness of 3 mm. Evaluation results on this photosensitive rubber plate are shown in Table 3.

EXAMPLES 2 TO 6 AND COMPARATIVE EXAMPLES 1 TO 6

Photosensitive compositions and photosensitive rubber plates were obtained in the same manner as in Example 1 except that the hydrophilic copolymer and/or block copolymers used in Example 1 were changed to the prescriptions shown in Table 3 or 4. Evaluation results on these photosensitive rubber plates are shown in Table 3 or Table 4.

TABLE 3

| | Example | | | | | |
| --- | --- | --- | --- | --- | --- | --- |
| | 1 | 2 | 3 | 4 | 5 | 6 |
| Block copolymer $\alpha$ [weight part] | 30 | — | — | — | — | — |
| $\beta$ | — | 30 | 30 | 30 | 20 | 15 |
| copolymer $\delta$ [weight part] | 15 | 15 | — | — | — | — |
| $\epsilon$ | — | — | 15 | — | — | — |
| $\zeta$ | — | — | — | 15 | 30 | 10 |
| Hydrophilic copolymer [weight part] | 55 | 55 | 55 | 55 | 50 | 75 |
| Washability | a | a | b | a | b | a |
| Transparency | 1.28 | 1.28 | 1.27 | 1.30 | 1.32 | 1.27 |
| Convex fine line reproduction [mm] | 0.08 | 0.08 | 0.10 | 0.08 | 0.10 | 0.08 |
| Concave fine line reproduction [mm] | 180 | 190 | 170 | 180 | 180 | 210 |
| Strength balance | 8300 | 8400 | 7900 | 8000 | 7400 | 6800 |

TABLE 4

|  | Comparative example | | | | | |
| --- | --- | --- | --- | --- | --- | --- |
|  | 1 | 2 | 3 | 4 | 5 | 6 |
| Block copolymer β [weight part] | 50 | 30 | 30 | 30 | 30 | — |
| copolymer ζ [weight part] | — | — | — | — | 40 | 70 |
| η | — | 15 | — | — | — | — |
| θ | — | — | 15 | — | — | — |
| ι | — | — | — | 15 | — | — |
| Hydrophilic copolymer [weight part] | 50 | 55 | 55 | 55 | 30 | 30 |
| Washability | b | d | e | d | e | e |
| Transparency | 1.34 | 1.28 | 1.64 | 1.32 | 1.56 | 1.54 |
| Convex fine line reproduction [mm] | 0.15 | 0.15 | * | 0.15 | * | * |
| Concave fine line reproduction [mm] | 160 | 130 | * | 120 | * | * |
| Strength balance | 9000 | 6100 | * | 7000 | * | * |

Note)
Since in Comparative examples 3, 5 and 6, transparency was extremely low, evaluation of fine line reproduction and strength balance was not conducted.

EXAMPLE 7

100 Parts of a block copolymer composed of a polystyrene block and a polybutadiene block (Kraton TR-1101, made by Shell Chemical Co.) and 10 parts of 1,6-hexanediol dimethacrylate were dissolved in 100 parts of toluene to obtain a solution of an adhesive composition having a solid content of 47.6%.

A polyethylene terephthalate film 125 μm thick coated with a silicone was coated with the solution of the adhesive composition using a bar coater having an interval of 0.1 mm, left alone at room temperature for 10 minutes, and further left alone in a desiccator of 70° C. for 5 minutes to obtain a base film composed of the polyethylene terephthalate film having provided thereon a thin film layer about 50 μm thick of the adhesive composition.

Separately, 10 parts of polyvinyl alcohol was dissolved in 90 parts of water to obtain an aqueous polyvinyl alcohol solution. A polyethylene terephthalate film 125 μm thick coated with a silicone was coated with the aqueous polyvinyl alcohol solution using a 1/1,000-inch coater, and left alone in a desiccator of 110° C. for one minute to obtain a protector film composed of the polyethylene terephthalate film having provided thereon a thin film layer (slip film) about 3 μm thick.

The polyethylene terephthalate films covering both sides of the the photosensitive rubber plate obtained in Example 1 were peeled, and the base film having the thin film layer of the adhesive composition and the protector film having the thin film layer of polyvinyl alcohol were superposed on the resultant photosensitive rubber plate so that the respective thin film layers could adhere to the different surfaces of the photosensitive rubber plate, respectively, and then contact-bonded thereto using a roller. Thus, there was obtained a laminate of the type shown in FIG. 1, namely, such a product that the base film 4 was laminated, through the adhesive composition layer 2, on one side of the photosensitive rubber plate 1, and the protector film 7 was laminated, through the slip film layer (the thin film layer of polyvinyl alcohol) 3, on the other side. The base film 4 and the protector film 7 each can be peeled with the adhesive composition layer 2 and the slip film layer 3 left on the photosensitive rubber plate 1.

Then, the base film 4 contact-bonded on the photosensitive rubber plate 1 was peeled to expose the adhesive composition layer 2, the exposed surface was irradiated with ultraviolet rays for 2 minutes using an ultraviolet ray irradiation machine (illuminance 5 mW/cm$^2$, exposure wavelength 320 to 400 nm). Ethyl acetate was spread on a rubber-made support plate 5 having a thickness of 4 mm, and the photosensitive rubber plate 1 irradiated with ultraviolet rays and the support plate 5 were superposed on each other so that the adhesive composition layer 2 and the side on which ethyl acetate was spread could contact, made to adhere to each other using a roller, and then left alone for 30 minutes to obtain a product of the type shown in FIG. 2.

The peel strength between the rubber plate 1 and the support plate 5 in this product was 0.91 kgf/cm, and the dimensions of the rubber plate 1 and the support plate 5 scarcely changed, compared with those before the adhesion.

From the above, it is seen that in the case of the composition wherein only the C-D-C type block copolymer of styrene-butadiene was compounded (Comparative example 1), image reproduction is insufficient.

Further, it is seen that in the case of the composition wherein the random copolymer wherein the amount of long chain of styrene was under 30% by weight, was compounded (Comparative example 2 or 4), washability is poor and image reproduction is low.

Further, it is seen that in the cases of the composition wherein the block copolymer having a large amount of styrene bound was compounded (Comparative example 3) and the composition wherein the compounding amount of the hydrophilic copolymer is small (Comparative example 5 or 6), washability is low.

On the other hand, it is seen that in the cases of the compositions wherein the A-B type block copolymer or the tapered A-B type block copolymer, and the C-D-C type block copolymer were compounded in combination (Examples), the photosensitive rubber plates obtained therefrom are excellent in washability, transparency, image reproduction and strength balance.

Particularly, it is seen that in the cases of the compositions wherein the tapered A-B type block copolymer was compounded (Examples 1, 2 and 4), the photosensitive rubber plates obtained therefrom are especially excellent in washability, image reproduction and strength balance.

What is claimed is:

1. A photosensitive composition which comprises
    5 to 55 parts by weight of a linear block copolymer ① consisting essentially of only one polymer block A which is a polymer consisting essentially of aromatic vinyl monomer units and only one or two polymer blocks B each of which is a polymer consisting essentially of conjugated diene monomer units, wherein among all the monomer units in the copolymer ① the aromatic vinyl monomer units constitute 15 to 30% by weight, the conjugated diene monomer units constitute 85 to 70% by weight, the total amount of the aromatic vinyl monomer units and the conjugated diene monomer units being 100% by weight, and wherein the total amount of the aromatic vinyl monomer units constituting molecular chain portions each having 8 or more successive aromatic vinyl monomer units is 30% by weight or more of the amount of all the aromatic vinyl monomer units, 10 to 60 parts by weight of a block copolymer ② consisting essentially of at least two polymer blocks C each of which is a polymer containing aromatic vinyl monomer units as the main constitutive units and at least one polymer block D which is a polymer containing conjugated diene monomer units as the main constitutive units, 35 to 85 parts by weight of a hydrophilic copolymer ③, provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤.

2. The photosensitive composition according to claim 1 which contains 5 to 35 parts by weight of the block copolymer ①, 10 to 60 parts by weight of the block copolymer ② and 35 to 85 parts by weight of the hydrophilic copolymer ③ provided that the total amount of the block copolymer ①, the block copolymer ② and the hydrophilic copolymer ③ is 100 parts by weight.

3. The photosensitive composition according to claim 1 wherein the aromatic vinyl monomer unit constituting the block copolymer ① or the block copolymer ② is a styrene unit.

4. The photosensitive composition according to claim 1 wherein the conjugated diene monomer unit constituting the block copolymer ① or the block copolymer ② is a 1,3-butadiene unit or an isoprene unit.

5. The photosensitive composition according to claim 1 wherein the block copolymer ① or the block copolymer ② is constituted by a 1,3-butadiene unit and a styrene unit.

6. The photosensitive composition according to claim 1 wherein the weight average molecular weight of the block copolymer ① is 100,000 to 400,000, and the value of weight average molecular weight/number average molecular weight is 1 to 1.5.

7. The photosensitive composition according to claim 1 wherein the vinyl bond content of the conjugated diene monomer unit part of the block copolymer ② is 15 to 70%.

8. The photosensitive composition according to claim 1 wherein the block copolymer ② has a block constitution represented by C-D-C or (C-D)$_2$-X wherein X is the residue of a coupling agent or polyfunctional ionic polymerization initiator.

9. The photosensitive composition according to claim 1 wherein the hydrophilic copolymer ③ has phosphoric ester groups or carboxyl groups bonded to the molecular side chains.

10. The photosensitive composition according to claim 1 wherein the hydrophilic copolymer ③ has phosphoric ester groups bonded to the molecular side chains.

11. A photosensitive rubber plate comprising the photosensitive composition according to claim 1.

12. A photosensitive rubber plate wherein a layer comprising the photosensitive composition according to claim 1 and a layer comprising an adhesive composition dissolving or swelling when contacted with an organic solvent are laminated.

13. A photosensitive rubber plate comprising (i) a photosensitive composition laminated to (ii) a layer comprising an adhesive composition which comprises a thermoplastic elastomer and a photopolymerizable ethylenically unsaturated monomer, wherein the photosensitive composition (i) comprises 5 to 55 parts by weight of a linear block copolymer ① comprising only one polymer block A which is a polymer containing aromatic vinyl monomer units as the main constitutive units and only one or two polymer blocks B each of which is a polymer containing conjugated diene monomer units as the main constitutive units, wherein among all the monomer units in the copolymer ① the aromatic vinyl monomer units constitute 15 to 30% by weight, the conjugated diene monomer units constitute 85 to 70% by weight, the total amount of the aromatic vinyl monomer units and the conjugated diene monomer units being 100% by weight, and wherein the total amount of the aromatic vinyl monomer units constituting molecular chain portions each having 8 or more successive aromatic vinyl monomer units is 30% by weight or more of the amount of all the aromatic vinyl monomer units, 10 to 60 parts by weight of a block copolymer ② comprising at least two polymer blocks C each of which is a polymer containing aromatic vinyl monomer units as the main constitutive units and at least one polymer block D which is a polymer containing conjugated diene monomer units as the main constitutive units, 35 to 85 parts by weight of a hydrophilic copolymer ③, provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤.

14. A photosensitive composition which comprises 5 to 55 parts by weight of a linear block copolymer ① comprising only one polymer block A which is a polymer containing aromatic vinyl monomer units as the main constitutive units and only one or two polymer blocks B each of which is a polymer containing conjugated diene monomer units as the main constitutive units, wherein among all the monomer units in the copolymer ① the aromatic vinyl monomer units constitute 15 to 30% by weight, the conjugated diene monomer units constitute 85 to 70% by weight, the total amount of the aromatic vinyl monomer units and the conjugated diene monomer units being 100% by weight, and wherein the total amount of the aromatic vinyl monomer units constituting molecular chain portions each having 8 or more successive aromatic vinyl monomer units is 30% by weight or more of the amount of all the aromatic vinyl monomer units, 10 to 60 parts by weight of a block copolymer ② comprising at least two polymer blocks C each of which is a polymer containing aromatic vinyl monomer units as the main constitutive units and at least one polymer block D which is a polymer containing conjugated diene monomer units as the main constitutive units, 35 to 85 parts by weight of a hydrophilic copolymer ③, provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤, wherein the molecular chain of the polymer block A of the block copolymer ① and the molecular chain of the polymer block B thereof are bound respectively to both ends of an intermediate molecular chain composed of aromatic vinyl monomer units and conjugated diene monomer units and having a monomer unit composition different from the monomer unit composition of the polymer block A and the monomer unit composition of the polymer block B, and the weight of the intermediate molecular chain is 40% by weight or less of the block copolymer ①, and the weight ratio of the polymer block A to the polymer block B is 15/85 to 30/70.

15. The photosensitive composition according to claim 14 wherein the intermediate molecular chain has such an amount (% by weight) distribution of aromatic vinyl monomer units that gradual change is made from the amount (% by weight) of the aromatic vinyl monomer units constituting the polymer block A to the amount (% by weight) of the aromatic vinyl monomer units constituting the polymer block B.

16. A photosensitive rubber plate comprising (i) a photosensitive composition laminated to (ii) a layer comprising an adhesive composition which comprises a thermoplastic elastomer, wherein the photosensitive composition (i) comprises 5 to 55 parts by weight of a linear block copolymer ① comprising only one polymer block A which is a polymer containing aromatic vinyl monomer units as the main constitutive units and only one or two polymer blocks B each of which is a polymer containing conjugated diene monomer units as the main constitutive units, wherein among all the monomer units in the copolymer ① the aromatic vinyl monomer units constitute 15 to 30% by weight, the conjugated diene monomer units constitute 85 to 70% by weight, the total amount of the aromatic vinyl monomer units and the conjugated diene monomer units being 100% by weight, and wherein the total amount of the aromatic vinyl monomer units constituting molecular chain portions each having 8 or more successive aromatic vinyl monomer units is 30% by weight or more of the amount of all the aromatic vinyl monomer units, 10 to 60 parts by weight of a block copolymer ② comprising at least two polymer blocks C each of which is a polymer containing aromatic vinyl monomer units as the main constitutive units and at least one polymer block D which is a polymer containing conjugated diene monomer units as the main constitutive units, 35 to 85 parts by weight of a hydrophilic copolymer ③, provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤.

17. The photosensitive rubber plate according to claim 16 wherein the thermoplastic elastomer is a block copolymer having a polymer block composed of a polymer containing an aromatic vinyl monomer unit as the main constitutive unit, and a polymer block composed of a polymer containing a conjugated diene monomer unit as the main constitutive unit.

18. The photosensitive rubber plate according to claim 16 wherein the thermoplastic elastomer is a block copolymer composed of a polystyrene block and a polybutadiene block or polyisoprene block.

19. A photosensitive composition which comprises 5 to 55 parts by weight of a linear block copolymer ① consisting essentially of only one polymer block A which is a polymer consisting essentially of aromatic vinyl monomer units as the main constitutive units and conjugated diene monomer units as secondary monomer units, and only one or two polymer blocks B each of which is a polymer consisting essentially of conjugated diene monomer units as the main constitutive units and aromatic vinyl monomer units as secondary monomer units, wherein among all the monomer units in the copolymer ① the aromatic vinyl monomer units constitute 15 to 30% by weight, the conjugated diene monomer units constitute 85 to 70% by weight, the total amount of the aromatic vinyl monomer units and the conjugated diene monomer units being 100% by weight, and wherein the total amount of the aromatic vinyl monomer units constituting molecular chain portions each having 8 or more successive aromatic vinyl monomer units is 30% by weight or more of the amount of all the aromatic vinyl monomer units, 10 to 60 parts by weight of a block copolymer ② consisting essentially of at least two polymer blocks C each of which is a polymer containing aromatic vinyl monomer units as the main constitutive units, and at least one polymer block D which is a polymer containing conjugated diene monomer units as the main constitutive units, 35 to 85 parts by weight of a hydrophilic copolymer ③, provided that the total amount of the block copolymer ①, the block copolymer ② and the hydrophilic copolymer ③ is 100 parts by weight, 5 to 300 parts by weight of a photopolymerizable ethylenically unsaturated monomer ④, and 0.1 to 10 parts by weight of a photopolymerization initiator ⑤.

* * * * *